(12) United States Patent
Fujioka et al.

(10) Patent No.: US 7,200,059 B2
(45) Date of Patent: Apr. 3, 2007

(54) SEMICONDUCTOR MEMORY AND BURN-IN TEST METHOD OF SEMICONDUCTOR MEMORY

(75) Inventors: Shinya Fujioka, Kawasaki (JP);
Yoshiaki Okuyama, Kawasaki (JP);
Yasuhiro Takada, Kawasaki (JP);
Tatsuhiro Watanabe, Kawasaki (JP);
Nobumi Kodama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/260,486

(22) Filed: Oct. 28, 2005

(65) Prior Publication Data

US 2006/0291307 A1    Dec. 28, 2006

(30) Foreign Application Priority Data

Jun. 27, 2005  (JP)  ............................. 2005-187389

(51) Int. Cl.
*G11C 29/00*    (2006.01)

(52) U.S. Cl. .......................... 365/201; 365/69; 365/203

(58) Field of Classification Search .................. 365/69, 365/201, 203
See application file for complete search history.

(56) References Cited

U.S. PATENT DOCUMENTS 5,995,427 A    11/1999    Tsukikawa 6,088,286 A *  7/2000    Yamauchi et al. ..... 365/230.06
7,023,748 B2 * 4/2006    Matsumoto ................. 365/200

FOREIGN PATENT DOCUMENTS

| JP | 10-340598 A | 12/1998 |
| JP | 2000-149588 A | 5/2000 |
| JP | 2004-355720 A | 12/2004 |
| KR | 2000-0035149 A | 6/2000 |

* cited by examiner

*Primary Examiner*—Hoai V. Ho
(74) *Attorney, Agent, or Firm*—Arent Fox PLLC

(57) ABSTRACT

A burn-in test, including first to sixth steps where voltages are applied for the same lengths of time in each step, is applied to a semiconductor memory having alternately arranged bit line pairs with twist structure where the bit lines cross each other and bit line pairs with non-twist structure where the bit lines are parallel to each other. Since lengths of time in which a stress is applied for all bit lines can be equally set, no deviation occurs in lengths of time where stress is applied between the bit lines. Characteristics of memory cells can be prevented from excessively deteriorating from the burn-in test. Further, the number of bit lines not having stress applied can be minimized in the first to sixth steps. Accordingly, the ratio of the bit lines having stress applied can be increased, which reduces the burn-in test time. Thus, test cost can be reduced.

10 Claims, 14 Drawing Sheets

| | first step | second step | third step | fourth step | fifth step | sixth step |
|---|---|---|---|---|---|---|
| | pattern 1 | pattern 2 | pattern 3 (reverse pattern of pattern 1) | pattern 4 (reverse pattern of pattern 2) | pattern 5 | pattern 6 (reverse pattern of pattern 5) |
| BL1 | H | H | L | L | H | L |
| /BL1 | L | L | H | H | H | L |
| BL2(T) | H | H | H | L | L | H |
| /BL2(T) | L | L | L | H | L | H |
| BL3 | H | H | L | L | H | L |
| /BL3 | L | L | H | H | L | L |
| BL4(T) | H | H | H | L | L | H |
| /BL4(T) | L | L | L | H | L | H |
| BL1-/BL1 | ○ | ○ | ○ | ○ | × | × |
| BL1-BL2 | ○ | × | × | × | ○ | ○ |
| BL2-/BL2 | ○ | ○ | ○ | ○ | × | × |
| /BL2-BL3 | ○ | × | × | × | ○ | ○ |
| BL3-/BL3 | ○ | ○ | ○ | ○ | × | × |
| /BL3-BL4 | ○ | × | × | × | ○ | ○ |
| BL4-/BL4 | ○ | ○ | ○ | ○ | × | × |
| /BL4-BL5 | ○ | × | × | × | ○ | ○ |

Fig. 9

| | pattern 1 | | pattern 2 | | pattern 3 (reverse pattern of pattern 1) | | pattern 4 (reverse pattern of pattern 2) | |
|---|---|---|---|---|---|---|---|---|
| BL1 | H | L | H | L | L | L | L | L |
| /BL1 | L | H | L | H | H | H | H | H |
| BL2(T) | H | L | H | L | L | H | L | L |
| /BL2(T) | L | H | L | H | H | L | H | H |
| BL3 | H | L | H | L | L | L | L | L |
| /BL3 | L | H | L | H | H | H | H | H |
| BL4(T) | H | L | H | L | L | H | L | L |
| /BL4(T) | L | H | L | H | H | L | H | H |
| BL1- /BL1 | ○ | ○ | ○ | ○ | ○ | ○ | ○ | ○ |
| /BL1- BL2 | ○ | × | ○ | × | ○ | × | ○ | × |
| BL2- /BL2 | ○ | ○ | ○ | ○ | ○ | ○ | ○ | ○ |
| /BL2- BL3 | ○ | × | ○ | × | ○ | × | ○ | × |
| BL3- /BL3 | ○ | ○ | ○ | ○ | ○ | ○ | ○ | ○ |
| /BL3- BL4 | ○ | × | ○ | × | ○ | × | ○ | × |
| BL4- /BL4 | ○ | ○ | ○ | ○ | ○ | ○ | ○ | ○ |
| /BL4- BL5 | ○ | × | ○ | × | ○ | × | ○ | × |

Fig. 10

SEMICONDUCTOR MEMORY AND BURN-IN TEST METHOD OF SEMICONDUCTOR MEMORY

CROSS REFERENCE TO RELATED APPLICATION

This application is based upon and claims the benefit of priority from Japanese Patent Application No. 2005-187389, filed on Jun. 27, 2005, the entire contents of which are incorporated herein by reference.

BACKGROUND OF THE INVENTION

1. Field of the Invention

The present invention relates to a burn-in test method of a semiconductor memory having a bit line twist structure in which bit lines cross each other.

2. Description of the Related Art

Semiconductor memories such as DRAMs have been used as work memories for portable equipments such as mobile phones. In recent years, mobile phones allow users to send character-string data or image data and to access the Internet in addition to allowing the users to make voice communications. The amount of data processed by mobile phones is tending to significantly increase. Accordingly, semiconductor memories having large capacities are in demand.

To increase the memory capacity of a semiconductor memory without increase in cost, memory vendors are moving to decrease the size of the device structures. However, if the distance between adjacent wiring lines is reduced due to the minute size of the device structures, the coupling capacitance between the wiring lines will increase. For example, operation characteristics of DRAMs deteriorate by increased parasitic capacitance between bit lines connected to memory cells.

To reduce data interference between bit lines due to the parasitic capacitance, a bit line twist structure has been proposed in which bit lines cross each other at the central part of a memory cell array. Due to the twist structure, the coupling capacitance between bit lines is reduced and operation characteristics are improved.

On the other hand, a semiconductor memory is generally subjected to a burn-in test during a test process. The burn-in test is an acceleration test for removing an initial failure in a short time by operating the semiconductor memory in a high temperature and high voltage condition. For example, a stress voltage is applied between all adjacent bit lines to remove a product in which a short failure may occur between bit lines or memory cells. Japanese Unexamined Patent Application Publication No. 2004-355720 discloses a burn-in test method of a semiconductor memory having a bit line twist structure. Japanese Unexamined Patent Application Publication No. Hei 10-340598 discloses a burn-in test method in which different voltages are applied to adjacent bit line pairs.

In the above-mentioned burn-in test method, stress is applied between all the bit lines using a plurality of test patterns in which a bit line is set to a high or low voltage level. In the above-mentioned documents, a precharge circuit (equalizer circuit) for setting the bit lines to precharge voltages or a precharge voltage generator is improved to facilitate a plurality of test patterns.

However, in a semiconductor memory having a bit line twist structure, adjacent bit lines are switched within a memory cell array. Therefore, when stress is applied between bit lines, the stress may not be applied to a part of the bit lines. In the above-mentioned burn-in test, in order to reliably remove an inferior product, it is necessary to apply stress between all bit lines for at least a predetermined length of time. If a pattern of voltage application to bit lines is not optimal, the ratio of bit lines to which stress is not applied increases. As a result, burn-in test time increases, which causes the test cost to increase.

SUMMARY OF THE INVENTION

It is an object of the invention to optimize a voltage pattern applied to a bit line during a burn-in test for the bit line, so as to reduce the burn-in test time.

According to a first aspect of the invention, a semiconductor memory is configured such that bit line pairs having a twist structure in which the bit lines cross each other and bit line pairs having a non-twist structure in which the bit lines are parallel to each other are alternately arranged. Each of the bit line pairs is composed of complementary bit lines connected to memory cells. The semiconductor memory is subjected to a burn-in test by performing the following first to sixth steps.

At the first step, high and low voltage levels are applied to the bit lines of each of the bit line pairs. At the second step, the same voltage level as that in the first step is applied to bit line pairs having a non-twist structure, and a voltage level opposite to that in the first step is applied to bit line pairs having a twist structure. At the third step, voltage levels opposite to those in the first step are applied to the bit lines of each of the bit line pairs. At the fourth step, the same voltage level as that in the third step is applied to the bit line pairs having a non-twist structure, and a voltage level opposite to that in the third step is applied to the bit line pairs having a twist structure. At the fifth step, a high or low voltage level is commonly applied to each of the bit line pairs, and voltage levels that are opposite to each other are applied to adjacent bit line pairs. At the sixth step, voltage levels opposite to those in the fifth step are applied.

The voltages are applied to the bit line pairs for the same lengths of time in each of the first to sixth steps. Stress is applied between all adjacent bit lines for the same length of time in each of the first to sixth steps. Since there is no deviation in the lengths of time that the stress is applied to the bit lines, there are no bit lines to which the stress is excessively applied. Accordingly, it is possible to prevent characteristics of memory cells from excessively deteriorating due to the burn-in test. Also, in the first to sixth steps, it is possible to minimize the number of bit lines to which the stress is not applied. Accordingly, it is possible to increase the ratio (burn-in efficiency) of bit lines to which the stress is applied, which causes burn-in time to be reduced. As a result, it is possible to reduce the test cost.

According to a second aspect of the invention, a precharge voltage generator generates a common precharge voltage to be supplied to first and second precharge voltage lines during a normal operation mode and a first burn-in test mode. Also, the precharge generator generates high and low voltage levels each to be supplied to one or the other of the first and second precharge voltage lines during a second burn-in test mode. A precharge circuits connects the bit line pairs having a twist structure to the first precharge voltage line and connects the bit line pairs having a non-twist structure to the second precharge voltage line while a bit line reset signal is activated.

A reset selection part activates the bit line reset signal upon non-access of the memory cell during the normal operation mode and the first burn-in test mode, and during the second burn-in test mode, and inactivates the bit line reset signal upon access of the memory cell during the normal operation mode and the first burn-in test mode. A sense amplifier selection part activates the sense amplifier activation signal upon access of the memory cell during the normal operation mode and the first burn-in test mode, and inactivates the sense amplifier activation signal upon non-access of the memory cell during the normal operation mode and the first burn-in test mode, and during the second burn-in test mode. A sense amplifier amplifies the voltage difference of the bit line pairs while a sense amplifier activation signal is activated. A column selection part activates the column selection signal upon access of the memory cell during the normal operation mode and the first burn-in test mode, and inactivates the column selection signal upon non-access of the memory cell during the normal operation mode and the first burn-in test mode, and during the second burn-in test mode. A column switch connects one of the bit line pairs to data bus lines while a column selection signal is activated.

Accordingly, in the burn-in test of a semiconductor memory, it is possible to switch between the first burn-in test in which different voltage levels are applied to the bit line pairs and the second burn-in test in which different voltage levels are applied to adjacent bit line pairs, thereby efficiently performing the burn-in test. Accordingly, it is possible to increase the ratio (burn-in efficiency) of the bit lines to which stress is applied, causing burn-in time to be reduced. As a result, it is possible to reduce the test cost. Also, since it is possible to eliminate deviation in the lengths of time that the stress is applied between the bit lines, it is possible to prevent characteristics of memory cells from excessively deteriorating due to the burn-in test.

According to a preferred example in the first aspect of the present invention, the semiconductor memory includes an operation control circuit which performs a write operation to write data to the memory cell according to a command and an address applied from the outside, a plurality of precharge circuits which connect adjacent bit line pairs having non-twist and twist structures to first and second precharge voltage lines, respectively, and a precharge voltage generator which generates voltage to be supplied to the first and second precharge voltage lines.

The first to fourth steps are performed by performing a write operation by the operation control circuit. The fifth and sixth steps are performed by generating opposite voltage levels on the first and second precharge voltage lines by the precharge voltage generator instead of performing a write operation by the operation control circuit. By performing the first to fourth steps by utilizing a circuit performing a write operation, the number of circuits to be formed within the semiconductor memory for the burn-in test can be minimal.

Further, according to a preferred example in the first and second aspects of the present invention, the command decoder decodes read and write commands applied from the outside to perform read and write operations with respect to the memory cells. When the command decoder receives an illegal command not used in normal read and write operations, an operation mode of the semiconductor memory shifts from a normal operation mode to a test mode. Specifically, when the value of a test code indicated by at least one of an address and data applied together with the illegal command indicates a burn-in test, an operation mode shifts to a first burn-in test mode (e.g., for performing the first to fourth steps) or to a second burn-in test mode (e.g., for performing the fifth and sixth steps) according to the value of the test code. Accordingly, in the invention, it is possible to selectively perform a plurality of different kinds of burn-in tests by an illegal command applied from the outside.

Furthermore, according to a preferred example in the first and second aspects of the present invention, when the illegal command and the test code indicate an entry command to shift to the first burn-in test mode, a write operation is performed by the operation control circuit in response to the entry command. For example, the write data is generated by the pattern generator in the data input/output circuit. The pattern generator generates data to be written to the bit lines and the memory cells according to the pattern selection signal. When the illegal command and the test code indicate an entry command to shift to the second burn-in test mode, each of the first and second precharge voltage lines are set to one or the other of high and low voltage levels according to the value of the test code. By using circuits which perform a write operation according to a performed test, the number of circuits to be formed within the semiconductor memory for the burn-in test can be minimal.

In addition, according to a preferred example in the first and second aspects of the present invention, when the illegal command and the test code received during the first and second burn-in test modes indicate an exit command, an operation mode shifts from the first and second burn-in test modes to the normal operation mode. By applying a common exit command to all the test modes, it is possible to easily return the semiconductor memory to the normal operation mode regardless of the test mode.

Further, according to a preferred example in the second aspect of the present invention, the command decoder outputs a first or second burn-in test signal to set an operation mode to the first or second burn-in test mode according to the test signal received by the test pad. When the test signal indicates the first burn-in test, the command decoder outputs a write signal to perform a write operation on the memory cell in synchronization with the test signal, and outputs a pattern selection signal. The pattern generator generates data to be written to the bit lines and the memory cells according to the pattern selection signal. The precharge voltage generator operates according to the second burn-in test signal. The reset selection part, the sense amplifier selection part, and the column selection part operate according to the write signal and the first and second burn-in test signals. Accordingly, it is possible to automatically perform the first burn-in test in the semiconductor memory without the need to receive an access command from the outside. Accordingly, it is possible to perform the first and second burn-in tests even when there are no expensive test apparatus. That is, it is possible to efficiently perform a burn-in test according to the test environment.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 9 is an explanatory diagram illustrating voltage patterns applied to bit lines in a burn-in test;

FIG. 10 is an explanatory diagram illustrating a comparative example of voltage patterns applied to bit lines;

DESCRIPTION OF THE PREFERRED EMBODIMENTS

Figure 1:
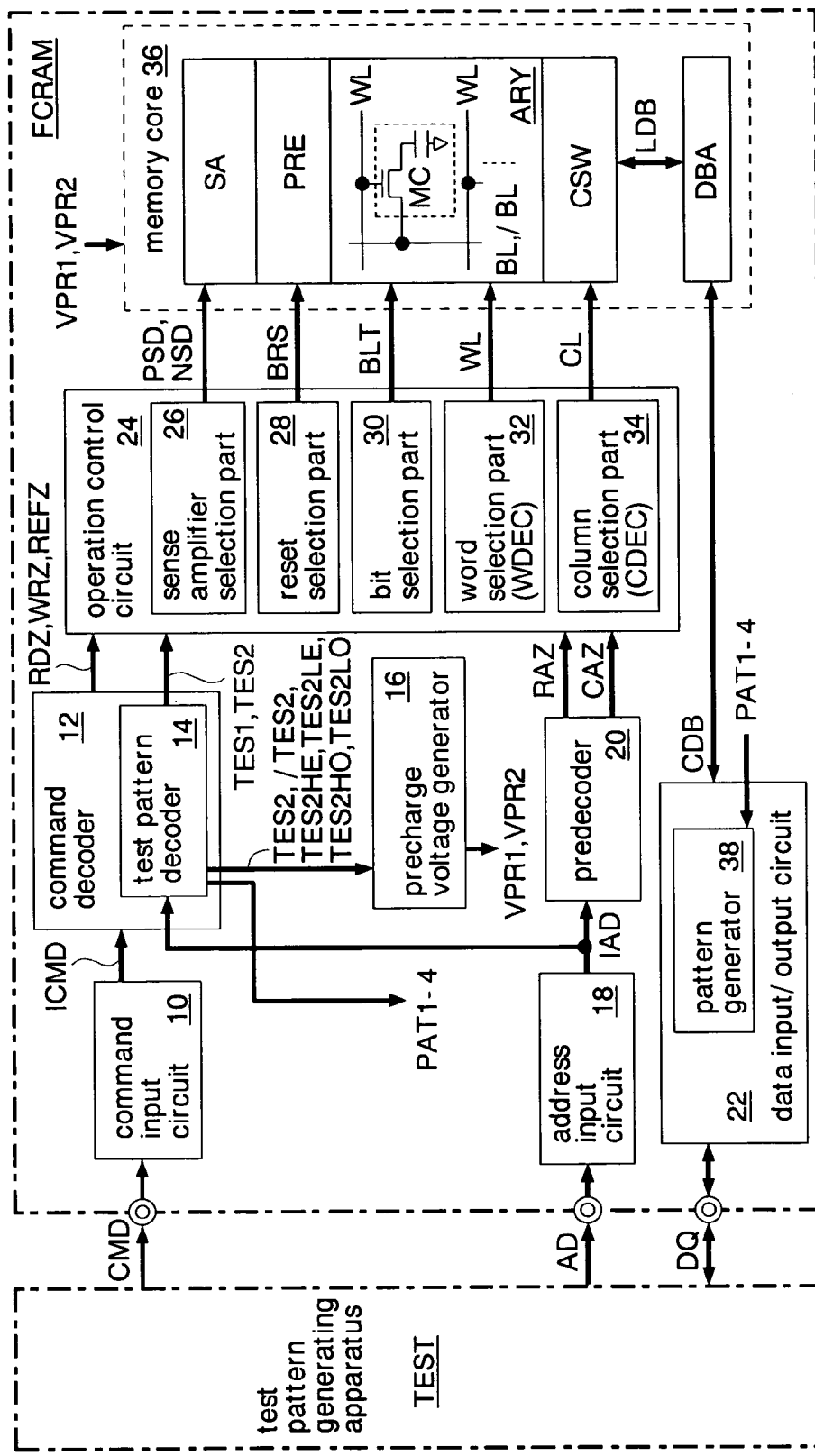
FIG. 1 is a block diagram illustrating a semiconductor memory according to a first embodiment of the invention.

Preferred embodiments of the invention will now be described with reference to the accompanying drawings. In the drawings, double circles denote an external terminal, and a bold signal line denotes a plurality of signal lines. A part of a block connected to a bold line is composed of a plurality of circuits. A signal line through which a signal is transferred is denoted by a symbol equal to the name of the signal. A signal suffixed with '/' indicates a negative logic. A signal prefixed with 'Z' indicates a positive logic.

FIG. 1 is a block diagram illustrating a semiconductor memory according to a first embodiment of the invention. The semiconductor memory is an FCRAM (Fast Cycle RAM) that has memory cells (dynamic memory cells) of a DRAM and an interface of an SRAM using a CMOS technology. The FCRAM is a kind of pseudo SRAM. The FCRAM performs a refresh operation inside a chip at regular intervals instead of receiving a refresh command from the outside, thereby maintaining data written in the memory cells. The FCRAM is used for the work memory mounted in a mobile phone. The invention can be applied to both a clock synchronous FCRAM and a clock asynchronous FCRAM.

The FCRAM includes a command input circuit 10, a command decoder. 12, a precharge voltage generator 16, an address input circuit 18, a predecoder 20, a data input/output circuit 22, an operation control circuit 24, and a memory core 36. In addition, the FCRAM further includes a refresh timer, a refresh counter, an arbiter for determining a priority between an external access request and an internal refresh request from the refresh timer, and a booster for generating a high voltage level of a word line.

The command input circuit 10 receives a command signal CMD (external access request signal, test command signal) applied through a command terminal CMD, and outputs the received signal as an internal command signal ICMD. The command signal CMD includes, for example, a chip enable signal/CE1, an output enable signal/OE, a write enable signal/WE, an upper byte signal/UB, and a lower byte signal/LB.

The command decoder 12 decodes the internal command signal ICMD and outputs a read signal RDZ for performing a read operation or a write signal WRZ for performing a write operation. Also, the command decoder 12 includes a test pattern decoder 14 which decodes a test command signal CMD and an address signal AD to generate a first burn-in test signal TES1, a second burn-in test signal TES2, and second burn-in test control signals/TES2, TES2HE, TES2LE, TES2HO, and TES2LO. During a normal operation mode NRML in which an access operation (read and write operations) is performed according to an external access request, the first and second burn-in test signals TES1 and TES2 are maintained at a low logic level. In the following first burn-in test mode TEST1, the first and second burn-in test signals TES1 and TES2 are maintained at a high logic level and a low logic level, respectively. In the following second burn-in test modes TEST2H and TEST2L, the first and second burn-in test signals TES1 and TES2 are maintained at a low logic level and a high logic level, respectively. The test pattern decoder 14 outputs pattern selection signals PAT1-4 according to a test command (entry command).

The precharge voltage generator 16 generates precharge voltages VPR1 and VPR2 for precharging the following bit lines BL and/BL. The precharge voltage generator 16 generates the precharge voltages VPR1 and VPR2 equal to each other (a voltage of about half of the following internal supply voltage VII) during the normal operation mode NRML and the first burn-in test mode TEST1. During the second burn-in test modes TEST2H and TEST2L, the precharge voltage generator 16 sets one of the precharge voltages VPR1 and VPR2 to a high voltage level (internal supply voltage VII) and sets the other to a low voltage level (ground voltage VSS).

The address input circuit 18 receives an address signal AD through an address terminal AD to output the received signal as an internal address signal IAD. The FCRAM is an address non-multiplex type memory which receives upper and lower addresses simultaneously. The predecoder 20 decodes the internal address signal IAD and generates a low decode signal RAZ and a column decode signal CAZ.

The data input/output circuit 22 receives data read from memory cells MC via a common data bus CDB to output the received data to data terminals DQ. Also, the data input/output circuit 22 receives write data through data terminals DQ to output the received data to a common data bus CDB. The data input/output circuit 22 includes a pattern generator 38 for generating test data patterns according to pattern selection signals PAT1-4 during the following burn-in test mode.

The operation control circuit 24 includes a sense amplifier selection part 26, a reset selection part 28, a bit selection part 30, a word selection part 32, and a column selection part 34 in order to make the memory core 36 perform a read operation, a write operation, or a refresh operation when it receives a read signal RDZ, a write signal WRZ, or a refresh signal REFZ. Each of the selection parts 26, 28, 30, 32, and 34 of the operation control circuit 24 operates according to the first and second burn-in test signals TES1, TES2.

The sense amplifier selection part 26 outputs sense amplifier activation signals PSD and NSD to activate sense amplifiers SA. Specifically, as will be described below, the sense amplifier selection part 26 activates the sense amplifier activation signals PSD and NSD upon access of the memory cells MC during the normal operation mode NRML and the first burn-in test mode TEST1. Further, the sense amplifier selection part 26 inactivates the sense amplifier activation signals PSD and NSD upon non-access of the memory cells MC during the normal operation mode NRML and the first burn-in test mode TEST1, and during the second burn-in test modes TEST2H and TEST2L.

The reset selection part 28 outputs a bit line reset signal BRS to equalize and precharge bit line pairs BL and/BL. Specifically, the reset selection part 28 activates the bit line reset signal BRS upon non-access of the memory cells MC during the normal operation mode NRML and the first burn-in test mode TEST1, and during the second burn-in test modes TEST2H and TEST2L. Further, the reset selection part 28 inactivates the bit reset signal BRS upon access of the memory cells MC during the normal operation mode NRML and the first burn-in test mode TEST1.

The bit selection part 30 outputs a bit line transfer signal BLT to connect the bit line pairs BL and/BL to the sense amplifiers SA. Specifically, the bit selection part 30 inactivates a predetermined bit line transfer signal BLT to separate the sense amplifiers SA from the bit line pairs BL and/BL corresponding to memory cells MC which are not accessed during a normal operation mode NRML, and activates all the bit line transfer signals BLT during the first and second burn-in test modes TEST1, TEST2H, and TEST2L.

The word selection part 32 activates any one of word lines WL according to a low decode signal RAZ. That is, the word selection part 32 functions as a word decoder WDEC. Specifically, the word selection part 32 activates any one of the word lines WL according to the low decode signal RAZ during a normal operation mode NRML, and activates all the word lines WL during the first and second burn-in test modes TEST1, TEST2H, and TEST2L.

The column selection part 34 activates any one of column selection lines CL according to a column decode signal CAZ. That is, the column selection part 34 acts as a column decoder CDEC. Specifically, the column selection part 34 activates a column selection signal CL upon access of the memory cells MC during the normal operation mode NRML and the first burn-in test mode TEST1, and inactivates the column selection signal CL upon non-access of the memory cells MC during the normal operation mode NRML and the first burn-in test mode TEST1, and during the second burn-in test modes TEST2H and TEST2L.

The memory core 36 includes a memory cell array ARY, a sense amplifier part SA, a precharge part PRE, a column switch part CSW, and a data bus amplifier part DBA. The memory cell array ARY includes a plurality of volatile dynamic memory cells MC, a plurality of word lines WL connected to the dynamic memory cells MC, and a plurality of bit line pairs BL and/BL.

Similar to a typical DRAM memory cell, the memory cell MC includes a capacitor for maintaining data as an electrical charge, and a transfer transistor disposed between the capacitor and the bit line BL (or/BL). A gate of the transfer transistor is connected to a word line WL. By selection of the word line WL, one of the read operation, the write operation, and the refresh operation is performed. The memory cell array ARY performs any one of read, write, and refresh operations, and performs a precharge operation for precharging the bit lines BL and/BL to a predetermined voltage in synchronization with the bit line reset signal BRS.

The sense amplifier part SA includes a plurality of sense amplifiers each of which is connected to the bit line pair BL and/BL. Each sense amplifier operates in synchronization with the activation of sense amplifier activation signals PSD and NSD and amplifies a voltage difference between the bit line pair BL and/BL. Data amplified by the sense amplifier is transferred to a data bus DB through a column switch during a read operation, and is written to memory cells MC through the bit line pair BL and/BL during a write operation.

The precharge part PRE includes a plurality of precharge circuits each of which is connected to the bit line pair BL and/BL. Each precharge circuit operates in synchronization with the activation (high logic level) of a bit line reset signal BRS, and connects the bit line BL and/BL to a precharge voltage line VPR1 (or VPR2). The column switch part CSW has a plurality of column switches each of which is connected to the bit line BL and/BL. Each column switch connects the bit line pair BL and/BL to a local data bus lines LDB during the activation of a column selection signal CL.

The data bus amplifier part DBA includes a plurality of read amplifiers and a plurality of write amplifiers. Each read amplifier amplifies the signal amount of read data on a local data bus LDB to output it to a common data bus CDB. Each write amplifier amplifies the signal amount of write data on a common data bus CDB to output it to a local data bus LDB.

When a burn-in test of FCRAM is performed, the FCRAM in a wafer state or a package state is connected to a burn-in test apparatus or a test pattern generating apparatus TEST such as LSI tester in a high temperature condition. In the following first burn-in test TEST1, a test command CMD and an address AD for selecting a first burn-in test TEST1 are applied from the test pattern generating apparatus TEST to the FCRAM, so that the operation mode of the FCRAM shifts from a normal operation mode NRML to the first burn-in test mode TEST1. Subsequently, the test pattern generating apparatus TEST outputs a test command (entry command) to the FCRAM to perform the write operation which has a long cycle time. Write data is generated in a pattern generator 38 provided in the data input/output circuit 22. The pattern generator 38 generates data to be written to bit lines BL and/BL and memory cells MC according to pattern selection signals PAT1-4 outputted from the test pattern decoder 14. Accordingly, different voltage levels are written to the bit line pair BL and/BL and the memory cells MC connected to the bit line pair BL and/BL, thereby performing the burn-in test.

Meanwhile, in the following second burn-in tests TEST2H and TEST2L, a test command CMD and an address AD for selecting the second burn-in tests TEST2H and TEST2L are applied from the test pattern generating apparatus TEST to the FCRAM, so that the operating mode of the FCRAM shifts from a normal operation mode NRML to one of the second burn-in test modes TEST2H and TEST2L. The FCRAM sets the precharge voltages VPR1 and VPR2 to an internal supply voltage VII and a ground voltage VSS during the second burn-in test modes TEST2H and TEST2L. Accordingly, an equal voltage (VII or VSS) is applied to the bit line pair BL and/BL and the memory cells MC connected to the bit line pair BL and/BL, thereby performing a burn-in test.

Figure 2:
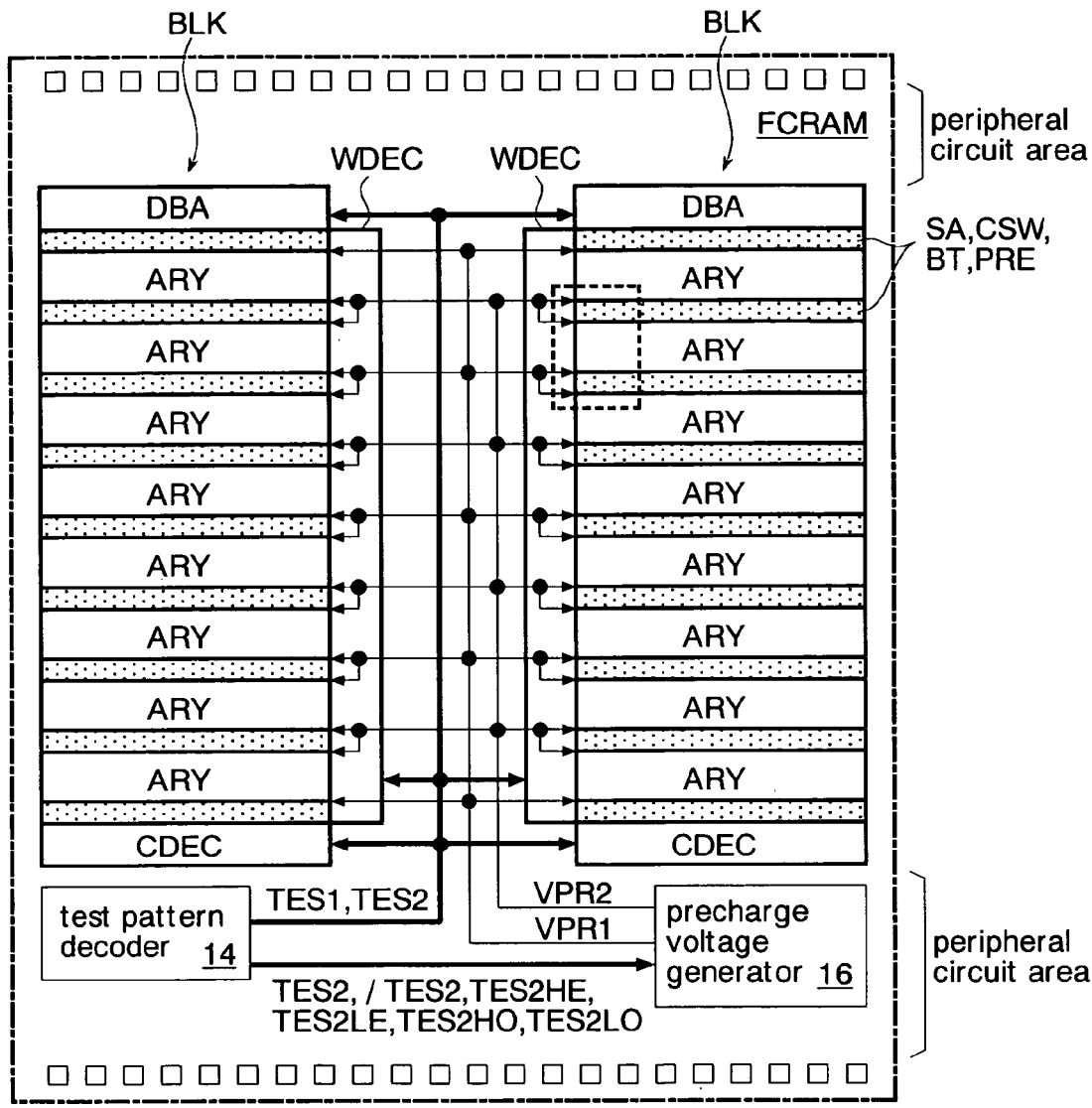
FIG. 2 illustrates a chip layout of an FCRAM shown in FIG. 1.

FIG. 2 is a chip layout of the FCRAM shown in FIG. 1. The FCRAM has a pair of memory blocks BLK in which a memory cell array ARY and a sense amplifier part SA are alternately arranged. The data bus amplifier DBA and the column decoder CDEC are provided on upper and lower sides of each memory block BLK, respectively. The word decoder WDEC is provided between the memory blocks BLK.

A plurality of pads is provided on upper and lower sides of the FCRAM chip along a transverse direction. Peripheral circuit areas are formed between each memory block BLK and the pad in rows. A test pattern decoder 14 and a precharge voltage generator 16 are provided in a peripheral circuit area on a lower side of the drawing. The precharge voltages VPR1 and VPR2 are applied to each memory cell array ARY. The first and second burn-in test signals TES1 and TES2 are applied to the data bus amplifier DBA, the word decoder WDEC, and the column decoder CDEC.

Figure 3:
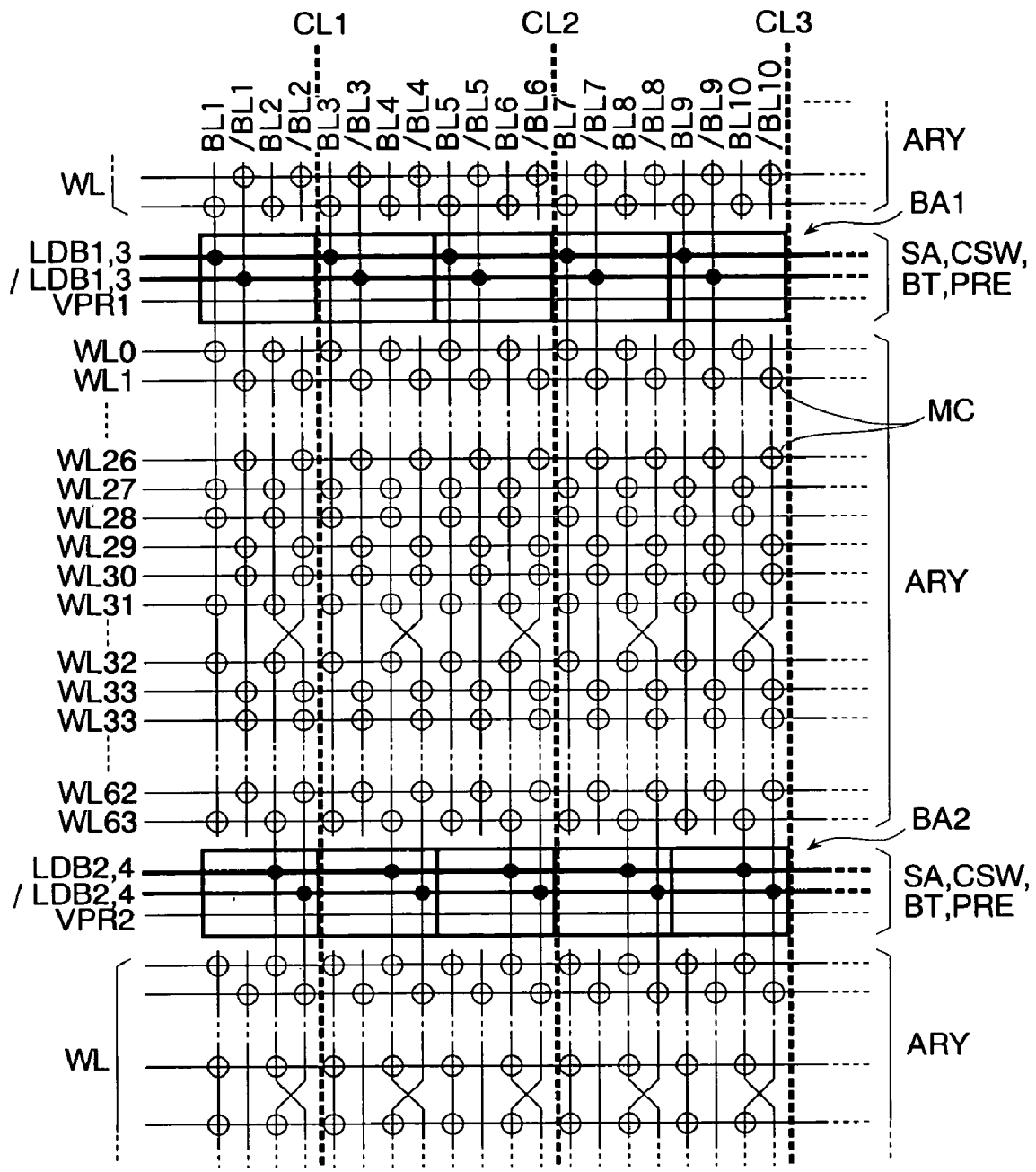
FIG. 3 is a detailed layout illustrating an area surrounded by a dotted line of FIG. 2.

FIG. 3 is a detailed layout illustrating the area surrounded by a dotted line of FIG. 2. Each memory cell array ARY has, for example, 64 word lines WL (WL0–WL63). A white circle located at an intersection of the word line WL and the bit line BL (or/BL) indicates the memory cell MC. The sense amplifier part SA, the column switch part CSW, the precharge part PRE, and the following bit line transfer switch BT are provided in boundary areas BA1 and BA2. The boundary areas BA1 and BA2 are commonly used in the bit line pair BL and/BL of an adjacent pair of the memory cell arrays ARY.

In the boundary area BA1, local data bus lines LDB1, 3, and/LDB1, 3, and the precharge voltage line VPR1 are arranged. In the boundary area BA2, local data bus lines LDB2, 4, and/LDB2, 4, and the precharge voltage line VPR2 are arranged. The local data bus lines LDB1–4, and/LDB1–4 are connected to the bit lines BL and/BL through a column switch depicted in a black circle in the drawing.

Odd-numbered bit line pairs (BL1 and/BL1, etc.) are arranged parallel to each other (non-twist structure). Even-numbered bit line pairs (BL2 and/BL2, etc.) cross each other at the central part of the memory cell array ARY (twist structure). That is, the bit line pairs with the non-twist structure and the bit line pairs with the twist structure are alternately arranged. The odd-numbered bit line pairs are connected to the boundary area BA1 on an upper side of the drawing. The even-numbered bit line pairs are connected to the boundary area BA2 on a lower side of the drawing. The bit line pair with non-twist structure is connected to the first precharge voltage line VPR1 by means of the precharge circuit in the boundary area BA1. The bit line pair with non-twisted structure is connected to the second precharge voltage line VPR2 by means of the precharge circuit in the boundary area BA2.

Figure 4:
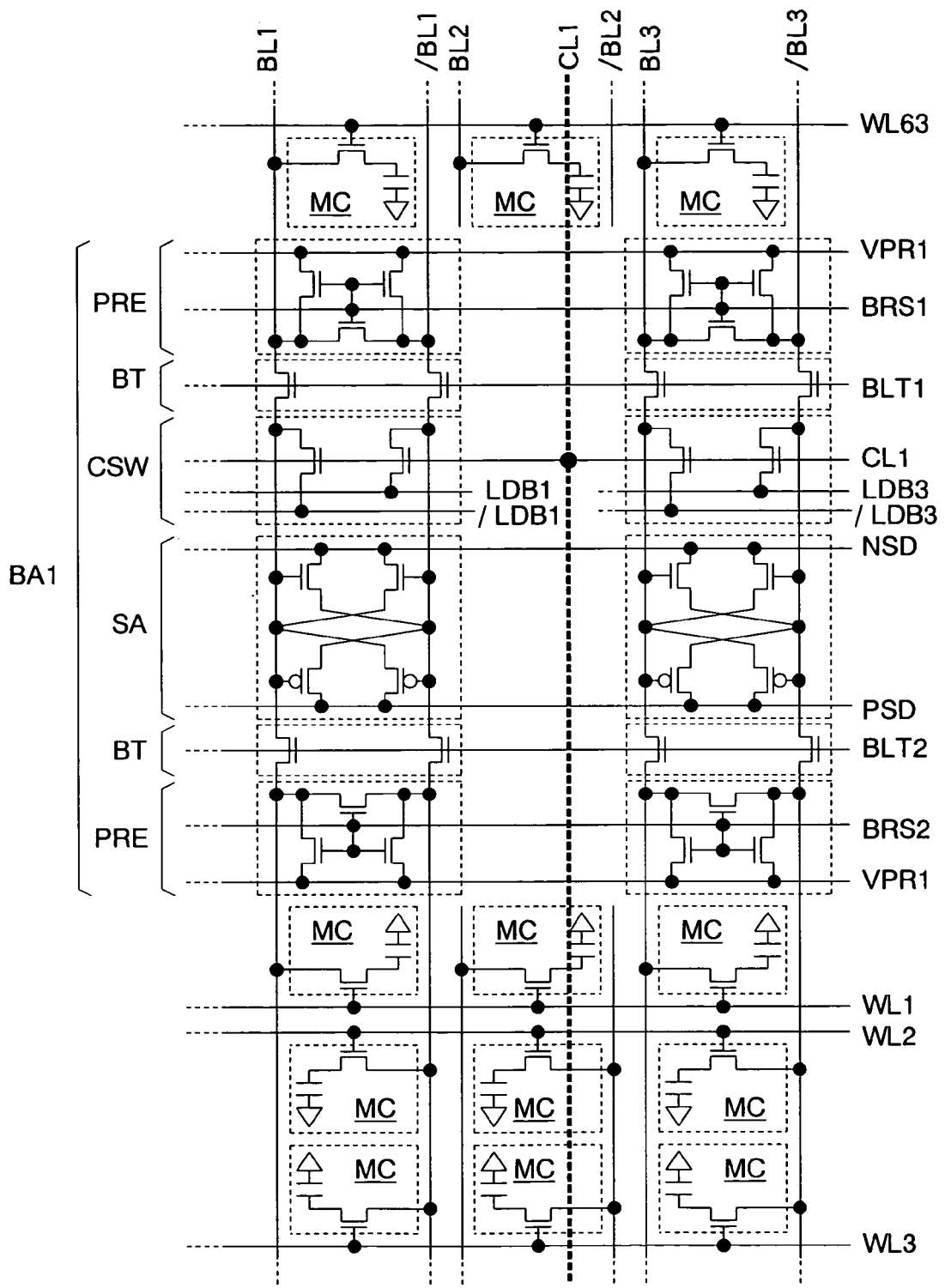
FIG. 4 is a detailed circuit diagram illustrating a boundary area depicted in FIG. 3.

FIG. 4 is a detailed circuit diagram illustrating the boundary area BA1 depicted in FIG. 3. The precharge circuit PRE is located on the memory cell array ARY side with respect to the bit line transfer switch BT. The precharge circuit PRE has a pair of nMOS transistors for connecting the bit lines BL and/BL to the precharge voltage line VPR1, and an nMOS transistor for connecting the bit lines BL and/BL to each other. A gate of the nMOS transistors of the precharge circuit PRE receives the bit line reset signal BRS (BRS1–2).

The bit line transfer switch BT is made up of nMOS transistors, and connects the bit lines BL and/BL to the sense amplifier SA. A gate of the bit line transfer switch BT receives the bit line transfer signal BLT (BLT1–2). A high voltage level of the bit line reset signal BRS and the bit line transfer signal BLT uses the boosted voltage to increase the voltage between the gate and source of the nMOS transistors and lower on-resistance.

The column switch CSW is composed of an nMOS transistor for connecting a bit line BL to a local data bus line LDB, and an nMOS transistor for connecting a bit line/BL to a local data bus line/LDB. The gate of each nMOS transistor constituting the column switch CSW receives a column selection signal CL1. A signal line of the column selection signal CL1 is arranged along the bit line pair BL and/BL.

The sense amplifier SA is composed of a latch circuit in which its common source is connected to sense amplifier activation signal lines NSD and PSD. The sense amplifier activation signal lines NSD and PSD are respectively connected to a source of each pMOS transistor and a source of each nMOS transistor, which constitute the latch circuit.

As shown in FIG. 3, the boundary area BA1 is formed to correspond to odd-numbered bit lines BL and/BL. Accordingly, an area corresponding to even-numbered bit lines BL and/BL is empty. Actually, circuits such as sense amplifiers SA within the boundary area BA1 are also formed in the empty area. For this reason; even when a gap between adjacent bit lines BL and/BL becomes small due to the shrunk size of the device structure, the sense amplifiers SA or the like can be easily provided.

Figure 5:
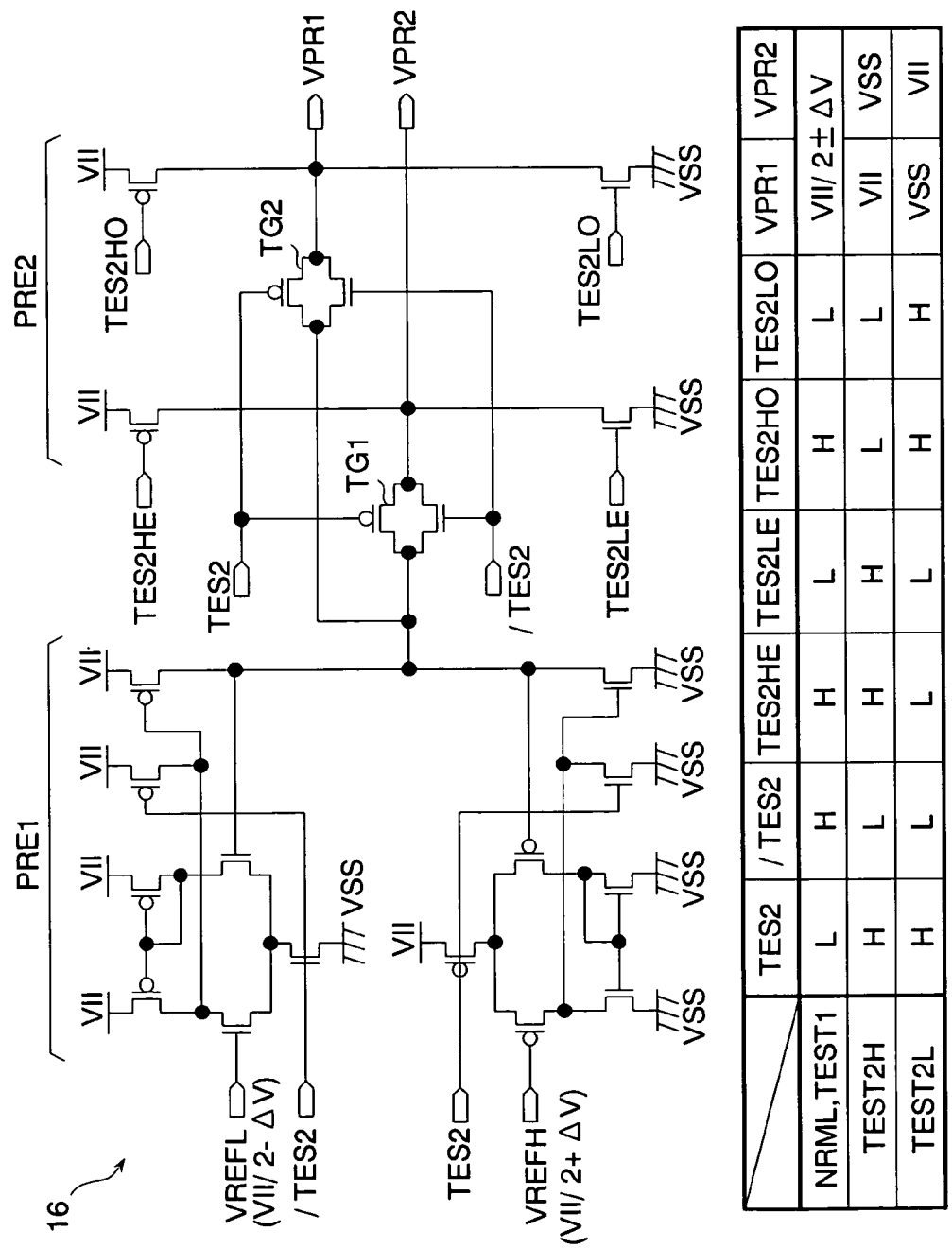
FIG. 5 is a detailed circuit diagram illustrating a precharge voltage generator shown FIG. 1.

FIG. 5 is a detailed circuit diagram illustrating the precharge voltage generator 16 shown FIG. 1. The precharge generator 16 has voltage-generating parts PRE1 and PRE2. The voltage generating part PRE1 generates precharge voltages VPR1 and VPR2 (VII/2) during the normal operation mode NRML and the first burn-in test mode TEST1. The voltage generating part PRE2 sets the precharge voltages VPR1 and VPR2 to any one of the internal supply voltage VII and a ground voltage VSS, respectively, during the second burn-in test modes TEST2H and TEST2L.

The voltage generating part PRE1 generates the precharge voltages VPR1 and VPR2 (both being VII/2) by using a reference voltage VREFL, which is equal to a little lower than VII/2, and a reference voltage VREFH, which is equal to a little higher than VII/2. During the second burn-in test modes TEST2H and TEST2L, the voltage generating part PRE1 receives a second burn-in test signal TES2 having a high logic level and a second burn-in test control signal/TES2 having a low logic level to be inactivated, thereby stopping a voltage-generating operation. At this time, by CMOS transfer gates TG1 and TG2, a connection between an output of the voltage generating part PRE1 and each of the precharge voltage lines VPR1 and VPR2 is cut off.

During the second burn-in test mode TEST2H, the voltage generating part PRE2 sets the precharge voltage lines VPR1 and VPR2 to an internal supply voltage VII and a ground voltage VSS, respectively. During the second burn-in test mode TEST2L, the voltage generating part PRE2 sets the precharge voltage lines VPR1 and VPR2 to a ground voltage VSS and an internal supply voltage VII, respectively.

The second burn-in test control signal/TES2 has a logic level opposite to that of the second burn-in test signal TES2. The second burn-in test control signals TES2HE and TES2LE are maintained at a high logic level during the second burn-in test mode TEST2H, and are maintained at a low logic level during the second burn-in test mode TEST2L. The second burn-in test control signals TES2HO and TES2LO are maintained at a high logic level during the second burn-in test mode TEST2L, and are maintained at a low logic level during the second burn-in test mode TEST2H. During the normal operation mode NRML, the second burn-in test control signals TES2HE and TES2HO are maintained at a high logic level, and the second burn-in test control signals TES2LE and TES2LO are maintained at a low logic level.

Figure 6:
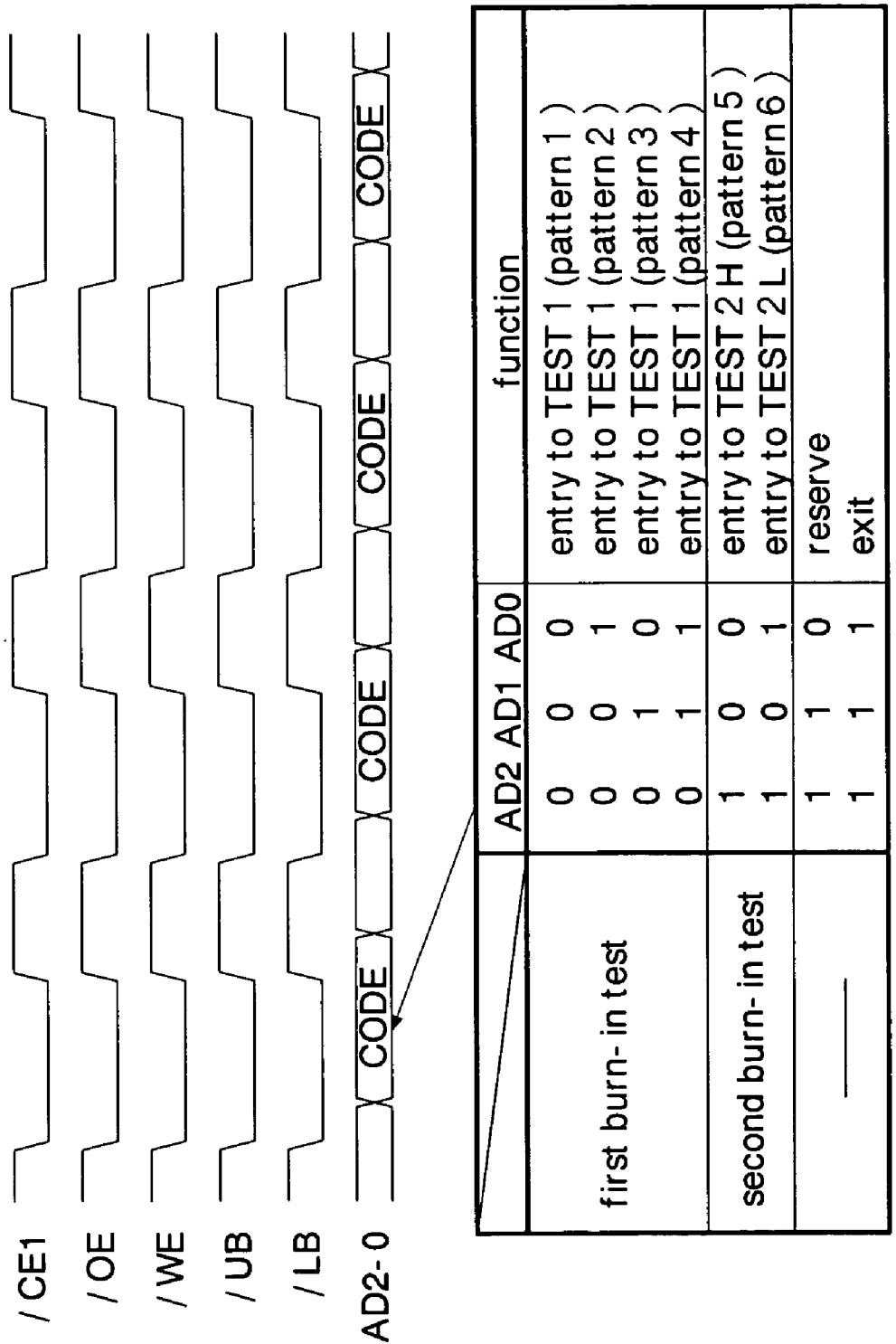
FIG. 6 is a timing diagram illustrating a test command sequence of the invention.

FIG. 6 is a timing diagram illustrating a test command sequence of the invention. The test command is received by asserting a chip enable signal/CE, an output enable signal/OE, a write enable signal/WE, an upper byte signal/UB, and a lower byte signal/LB to low logic levels four times consecutively, and at the same time, by applying a test code CODE to an address signal AD2-0. The output enable signal/OE is set to a low logic level upon performing a read operation, and the write enable signal/WE is set to a low logic level upon performing a write operation. Accordingly, a test command by which the signals /OE and /WE are simultaneously changed to a low logic level is an illegal command which is not used in normal read and write operations.

When the test pattern decoder 14 shown in FIG. 1 receives binary address signals AD2-0 of '000', '001', '010', and '011', it makes an entry to the first burn-in test mode TEST1 (pattern 1), TEST1 (pattern 2), TEST1 (pattern 3), and TEST1 (pattern 4), respectively, to start testing (entry command). Similarly, when the test pattern decoder 14 receives binary address signals AD2-0 of '100' and '101', it makes an entry to the second burn-in test mode TEST2H and TEST2L, respectively, to start testing (entry command).

In addition, when the test pattern decoder 14 receives a binary address signal AD2-0 of '111', it exits from a test mode regardless of a test mode to which an entry is made, and returns to a normal operation mode NRML (exit command). By setting a common exit command for all the test modes, an operation mode can easily return to a normal operation mode NRML regardless of a test mode.

By receiving a test code CODE using the address terminals AD, it is possible to select and perform a desired test item among a plurality of test items. In general, since the address terminals AD have a lot of bits, it is possible to greatly increase the number of test items to be selected. For example, it is possible to selectively perform 256 test items with eight-bit address terminals.

Figure 7:
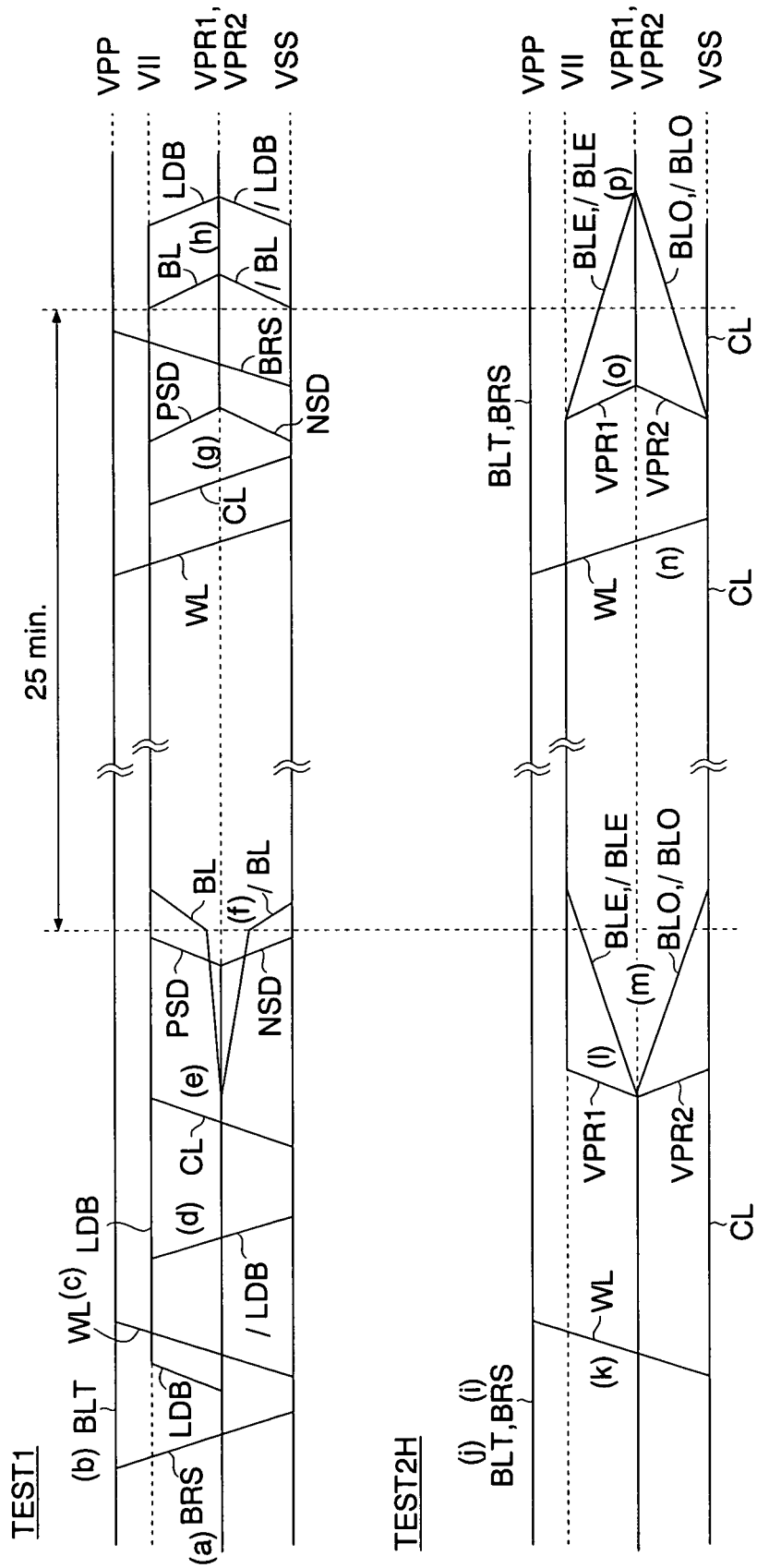
FIG. 7 is a waveform diagram illustrating operations in first and second burn-in test modes according to the invention.

FIG. 7 is a waveform diagram illustrating the operation of the memory core 36 in the first burn-in test mode TEST1 and the second burn-in test mode TEST2H according to the invention. In the first burn-in test mode TEST1, the command signal CMD and the data signal DQ are supplied from the test pattern generating apparatus TEST shown in FIG. 1. In the first burn-in test mode TEST1, data is written to all the memory cells MC. Accordingly, it is not necessary to apply the address signal AD.

In the first burn-in test mode TEST1, a write operation is performed during an extremely longer time period (e.g., 25 minutes) than a normal write cycle time. That is, when the write operation is performed once, stress is applied to each bit line pair BL and /BL for 25 minutes. The write cycle time is not limited to '25 minutes', but varies according to the types of semiconductor fabrication process technology, applied voltage, or temperatures of FCRAM.

The following operations are performed in all bit lines BL and /BL and the memory cells MC. That is, in the first burn-in test mode TEST1, the operation control circuit 24 receives the first burn-in test signal TES1 from the test pattern decoder 14, operates all write amplifiers to switch on all column switches CSW, operates all sense amplifiers SA to switch on all bit line transfer switches BT, and activates all word lines WL. By performing the first burn-in test TEST1 using a circuit performing a write operation, it is possible to minimize the number of circuits for the burn-in test provided in the FCRAM. As a result, it is possible to prevent the chip size of FCRAM from increasing.

First, a bit line reset signal BRS is inactivated to a low logic level so that the precharge operation of the bit lines BL and /BL is terminated ((a) of FIG. 7). Since all of the bit line transfer signals BLT are maintained at a high logic level, all the bit line transfer switches BT are turned on ((b) of FIG. 7). Accordingly, all of the bit lines BL and /BL are connected to the sense amplifier SA.

Next, the word line WL is activated so that the bit lines BL and /BL are connected to the memory cells MC ((c) of FIG. 7). Write data generated by the pattern generator 38 is transferred to local data bus lines LDB and /LDB ((d) of FIG. 7). The column selection line CL is activated to a high logic level so that write data is transferred to the bit lines BL and /BL ((e) of FIG. 7). At this time, complementary data is transferred to the bit line BL and /BL. Subsequently, the sense amplifier activation signals PSD and NSD are activated to high and low logic levels so that the sense amplifier SA amplifies a voltage difference of the bit lines BL and /BL ((f) of FIG. 7). A voltage stress is applied between complementary bit lines BL and /BL of a bit line pair, and a voltage stress is applied between the memory cells MC.

After applying the stress, in response to the termination of the write command from the test pattern generating apparatus TEST, the word line WL, the column selection line CL, the sense amplifier activation signals PSD and NSD are sequentially inactivated, and the bit line reset signal BRS is activated ((g) of FIG. 7). With the activation of the bit line reset signal BRS and the bit lines BL and /BL are set to the precharge voltage VPR (VII/2) ((h) of FIG. 7).

Meanwhile, in the second burn-in test modes TEST2H and TEST2L, the FCRAM continues to perform the write operation until the exit command is applied from the test pattern generating apparatus TEST. The second burn-in test TEST2L is the same operation as the second burn-in test TEST2H except that voltage patterns supplied to the bit lines BL and /BL are different. The following operations are performed by all the bit lines BL and /BL and the memory cells MC. Also, in the second burn-in test modes TEST2H and TEST2L, the operation control circuit 24 receives the second burn-in test signal TES2 from the test pattern decoder 14 so that all the write amplifiers are inactivated, and switches off all the column switch CSW so that all the sense amplifiers SA are inactivated.

Since all of the bit line transfer signals BLT are maintained at a high logic level, all the bit line transfer switches BT are switched on ((i) of FIG. 7). Therefore, all of the bit lines BL and /BL are connected to the precharge circuit PRE. Also, since all the bit line reset signals BRS are activated to a high logic level, all nMOS transistors of the precharge circuit PRE shown in FIG. 4 are turned on ((j) of FIG. 7).

First, the word lines WL are activated so that the memory cells MC are connected to the bit lines BL and /BL ((k) of FIG. 7). The precharge voltage generator 16 stops the operation of the voltage generating part PRE1 with the activation of the second burn-in test signal TES2 and the second burn-in test control signal /TES2. The precharge voltage generator 16 starts the operation of the voltage generating part PRE2, sets one of the precharge voltages VPR1 and VPR2 to an internal supply voltage VII, and sets the other to a ground voltage VSS ((l) of FIG. 7). Since the present embodiment shows the second burn-in test TEST2H, the precharge voltages VPR1 and VPR2 are set to the internal supply voltage VII and the ground voltage VSS.

Since the nMOS transistor of the precharge circuit PRE is turned on, the voltage of the odd-numbered bit line pair designated by "BLO and /BLO" and the voltage of the even-numbered bit line pair designated by "BLE and /BLE" are set to precharge voltage VPR1 (=VII) and VPR2 (=VSS), respectively ((m) of FIG. 7). A voltage stress is applied between the bit lines BL and /BL, and a voltage stress is applied between the memory cells MC.

After applying the stress, the word line WL which receives an exit command is inactivated ((n) of FIG. 7). When the precharge voltage generator 16 receives an exit command, the precharge voltage generator 16 stops the operation of the voltage generating part PRE2, and restarts the operation of the voltage generating part PRE1. Accordingly, the precharge voltages VPR1 and VPR2 are set to half (VII/2) of the internal supply voltage VII ((o) of FIG. 7). As the precharge voltages VPR1 and VPR2 change, the voltages of the bit lines BL and/BL change to VII/2 ((p) of FIG. 7).

Figure 8:
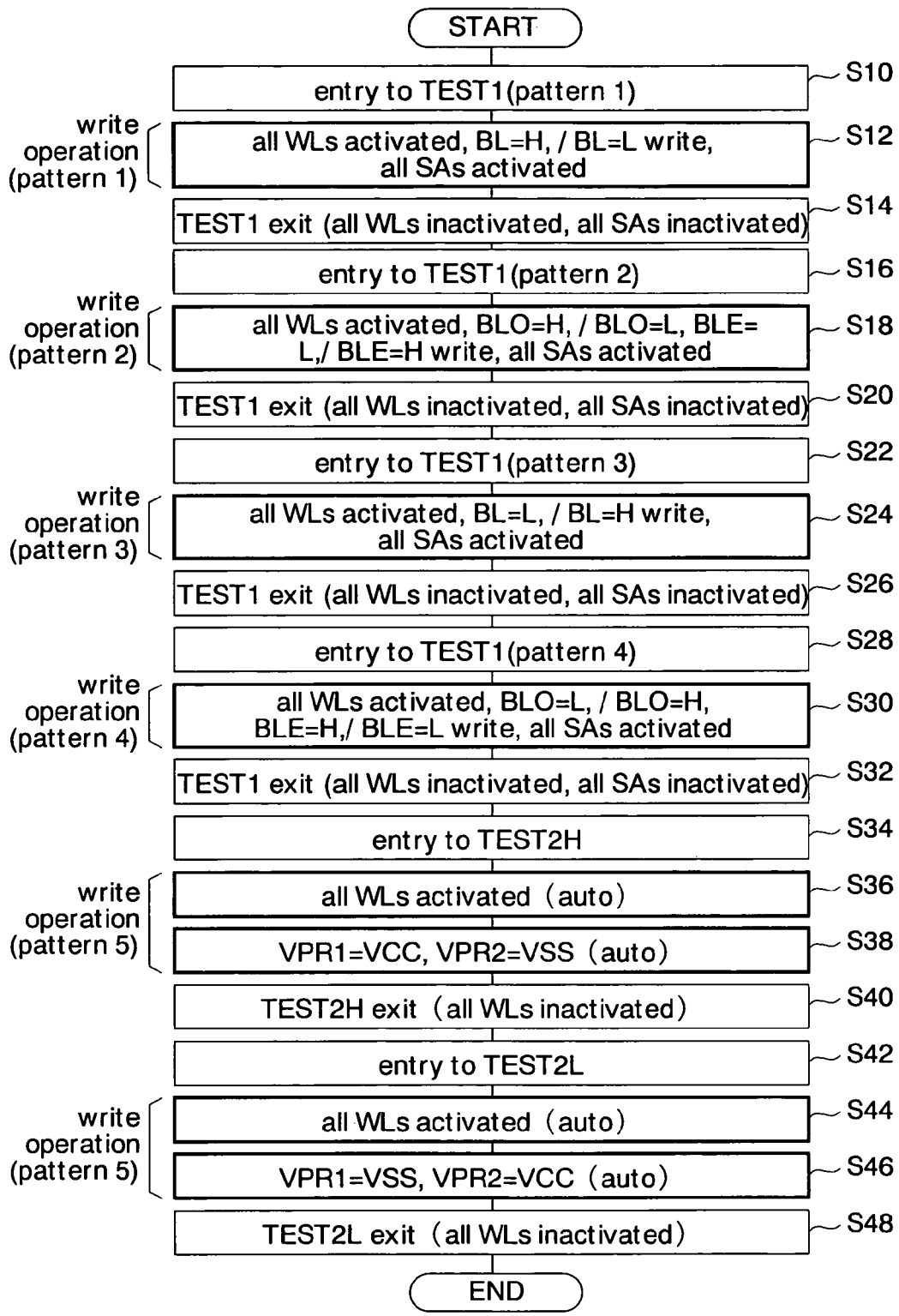
FIG. 8 is a flow chart illustrating a burn-in test of an FCRAM according to the first embodiment of the invention.

FIG. 8 is a flow chart illustrating a burn-in test of an FCRAM according to a first embodiment of the invention. The flow shown in the drawing is performed under the control of the test pattern generating apparatus TEST connected to the FCRAM. Steps depicted by thin frames are performed by the test pattern generating apparatus TEST. Steps depicted by thick frames are performed by the FCRAM. In the present embodiment, the first burn-in test TEST1 and the second burn-in tests TEST2H and TEST2L are sequentially performed. The first burn-in test TEST1 and the second burn-in tests TEST2H and TEST2L are automatically performed within the FCRAM. By providing the test pattern decoder 14 in the command decoder 12, it is possible to switch between the first burn-in test TEST1 and the second burn-in tests TEST2H and TEST2L, which are different in circuit operations from each other, thereby efficiently performing the burn-in test.

In step S10, the entry command (AD2-0=000) for performing the first burn-in test TEST1 (pattern 1) is applied to the FCRAM. The operation mode of FCRAM shifts from the normal operation mode NRML to the first burn-in test mode TEST1. In response to an entry of the first burn-in test mode TEST1, the FCRAM performs step S12 at the timing shown in FIG. 7 and writes a high logic level data H (VII) and a low logic level data L (VSS) on all the bit lines BL and/BL and corresponding memory cells MC (pattern 1 shown in FIG. 9). Accordingly, a voltage stress is applied between the bit lines BL and/BL, and a voltage stress is applied between the memory cells MC (the first step of the burn-in test).

In step S14, the test pattern generating apparatus TEST applies the exit command to the FCRAM in 25 minutes. In response to the exit command, the FCRAM inactivates all the word lines WL and all the sense amplifiers SA. That is, the write operation of the pattern 1 is terminated. In response to the exit command, the operation mode of the FCRAM shifts from the first burn-in test mode TEST1 to the normal operation mode NRML.

In step S16, the test pattern generating apparatus TEST applies the entry command (AD2-0=001) for performing the first burn-in test TEST1 (pattern 2) to the FCRAM. In response to the entry command, the FCRAM performs step S18, writes data H and data L on odd-numbered bit lines BLO and/BLO and corresponding memory cells MC, and writes data L and data H on even-numbered bit lines BLE and/BLE and corresponding memory cells MC (pattern 2 shown in FIG. 9). Accordingly, a voltage stress is applied between the bit lines BL and/BL, and a voltage stress is applied between the memory cells MC (the second step of the burn-in test). In step S20, the test pattern generating apparatus TEST applies the exit command to the FCRAM in 25 minutes. In response to the exit command, the FCRAM inactivates all the word lines WL and all the sense amplifiers SA. That is, the write operation of the pattern 2 is terminated.

Steps S22, S24, and S26 are performed similar to the above-mentioned steps so that a reverse pattern of pattern 1 (pattern 3 shown in FIG. 9) is written for 25 minutes (the third step of the burn-in test). In addition, steps S28, S30, and S32 are performed so that a reverse pattern of the pattern 2 (pattern 4 shown in FIG. 9) is written for 25 minutes (the fourth step of the burn-in test). Steps S12, S18, S24, and S30 are automatically performed inside the FCRAM without the control of the test pattern generating apparatus TEST.

Subsequently, in step S34, the test pattern generating apparatus TEST applies the entry command (AD2-0=100) for performing the second burn-in test TEST2H to the FCRAM. In response to the entry command, the operation mode of FCRAM shifts from the normal operation mode NRML to the second burn-in test mode TEST2H.

In step S36, the FCRAM activates all the word lines WL. In step S38, the FCRAM sets the precharge voltages VPR1 and VPR2 to an internal supply voltage VII and a ground voltage VSS, respectively. Accordingly, data H is written on odd-numbered bit line pair BLO and/BLO and corresponding memory cells MC (the fifth step of the burn-in test). Data L is written on even-numbered bit line pair BLE and/BLE and corresponding memory cells MC (pattern 5 shown in FIG. 9). Steps S36 and S38 are automatically performed inside the FCRAM without the control of the test pattern generating apparatus TEST.

In step S40, the test pattern generating apparatus TEST applies the exit command (AD2-0=111) for terminating the second burn-in test TEST2H to the FCRAM in 25 minutes from the entry of the second burn-in test TEST2H. In response to the exit command, the operation mode of FCRAM shifts from the second burn-in test mode TEST2H to the normal operation mode NRML.

In step S42, the test pattern generating apparatus TEST applies the entry command (AD2-0=101) for performing the second burn-in test TEST2H to the FCRAM. In response to the entry command, the operation mode of FCRAM shifts from the normal operation mode NRML to the second burn-in test mode TEST2L.

In step S44, the FCRAM activates all the word lines WL. In step S46, the FCRAM sets the precharge voltages VPR1 and VPR2 to a ground voltage VSS and an internal supply voltage VII, respectively. Accordingly, a reverse pattern of pattern 5 is written on the bit lines BL and/BL (the sixth step of the burn-in test). That is, data L is written on odd-numbered bit line pair BLO and/BLO and corresponding memory cells MC, and data H is written on even-numbered bit line pair BLE and/BLE and corresponding memory cells MC (pattern 6 shown in FIG. 9). Steps S44 and S46 are automatically performed inside the FCRAM without the control of the test pattern generating apparatus TEST.

In step S48, the test pattern generating apparatus TEST applies the exit command (AD2-0=111) for terminating the second burn-in test TEST2L to the FCRAM in 25 minutes from the entry of the second burn-in test TEST2L. In response to the exit command, the operation mode of FCRAM shifts from the second burn-in test mode TEST2L to the normal operation mode NRML. Accordingly, the burn-in test of the FCRAM is terminated.

FIG. 9 illustrates voltage patterns applied to the bit lines BL and/BL in a burn-in test. In the drawing, symbols 'H' and 'L' mean that an internal supply voltage VII and a ground voltage VSS are applied to bit lines BL and/BL, respectively. A dotted line within each pattern range indicates an intersecting part (the central part of the memory cell array ARY) of the bit lines BL and/BL. Therefore, in bit lines (such as BL2 and/BL2, etc.), having a twist structure, suffixed with '(T)', applied voltages are switched to each other at both sides of the dotted line.

The circle in the drawing indicates that a stress is applied between bit lines. A single circle indicates the stress is applied for 25 minutes. The mark 'X' in the drawing indicates that a stress is not applied between bit lines. Between the bit lines, half bit lines BL and/BL corresponding to a left side of the dotted line have four circles marked. Similarly, between the bit lines, half bit lines BL and/BL corresponding to the right side of the dotted line have four circles marked. Accordingly, a stress is applied between the bit lines for 100 minutes during the burn-in test. That is, by the stress application of six patterns, the stress can be applied between adjacent all bit lines during equal lengths of time. The burn-in test performs six-pattern stress application (25 minutes, respectively) for 150 minutes. Therefore, 67% of the test times contribute to actual stress application.

FIG. 10 illustrates a comparative example of voltage patterns applied to the bit lines BL and/BL. In the present example, the burn-in test is performed only by the write operation through the test pattern generating apparatus TEST. In this case, the number of circles indicating the stress application between the same bit line pair BL and/BL (e.g., BL1 and/BL1) is different from the number of circles indicating the stress application between the adjacent bit line pair (e.g.,/BL1 and BL2). It is necessary to perform the burn-in test corresponding to the side where the number of circles is small. Accordingly, since the stress is applied between the bit lines for 100 minutes, the application time for one pattern should be 50 minutes. As a result, since the burn-in test time is 200 minutes, only 50% of the test time can contribute to the actual stress application. In other words, the burn-in test time increases compared with the invention. In addition, for example, the number of circles of BL1-/BL1 between bit lines is twice as much as the number of circles of/BL1-BL2 between bit lines. That is, the stress applied to the BL1-/BL1 between bit lines is twice as much as the stress applied to the/BL1-BL2 between bit lines. If the stress is excessively applied, characteristics of memory cells may deteriorate. In the invention, as shown in FIG. 9, the stress is applied to the bit lines BL and/BL for a total of 100 minutes, and there is no deviation. That is, since there are no bit lines BL and/BL to which the stress is excessively applied, it is possible to prevent the characteristics of the memory cells MCs from deteriorating due to the burn-in test.

According to the first embodiment, since the burn-in test is performed by combining the first burn-in test TEST1 and the second burn-in test TEST2H, TEST2L, it is possible to minimize the number of bit lines BL and/BL to which a stress is not applied in each test pattern. Accordingly, it is possible to increase the ratio (burn-in efficiency) of bit lines to which the stress is applied, causing burn-in time to be reduced. As a result, it is possible to reduce the test cost.

Figure 11:
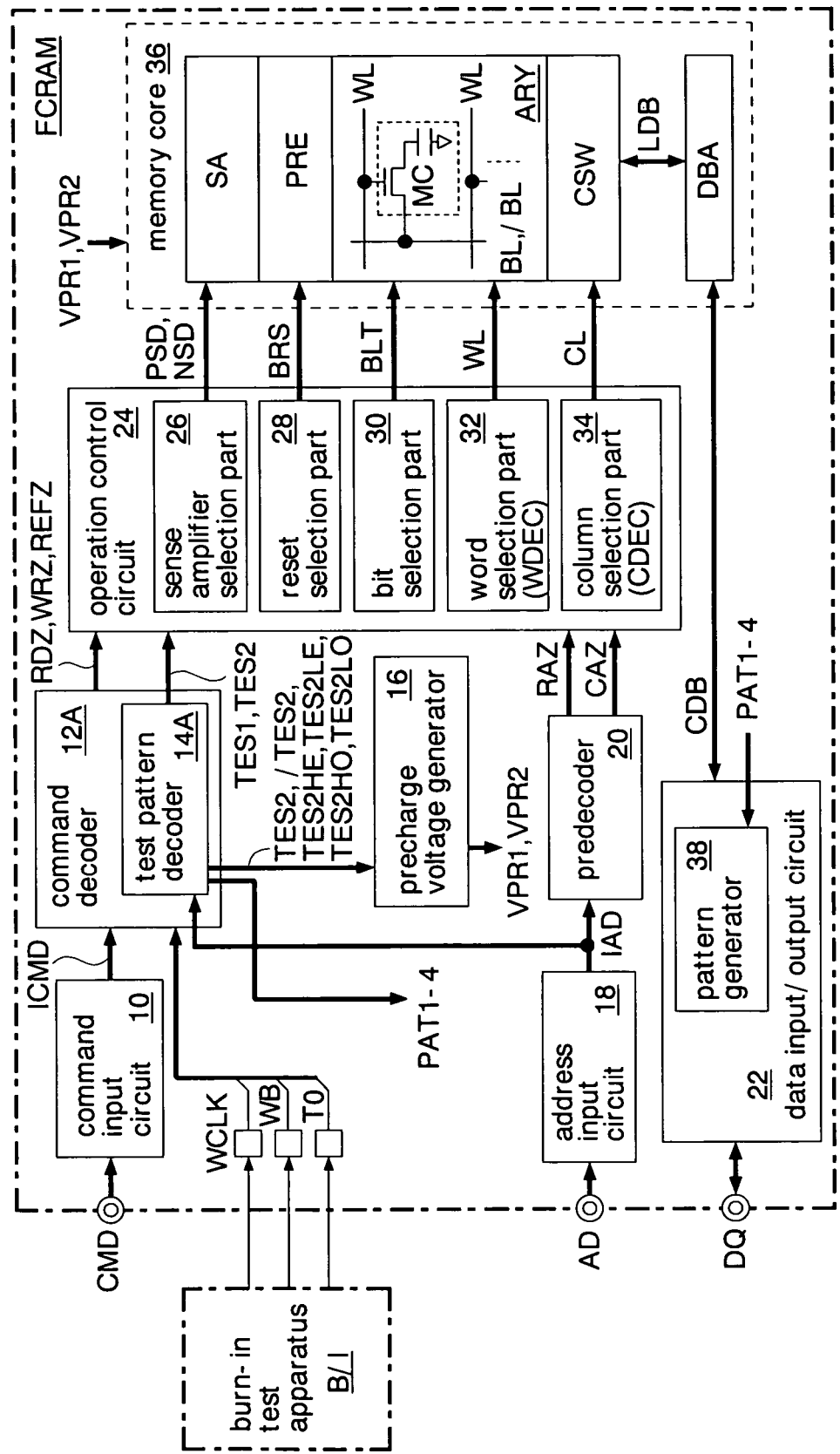
FIG. 11 is a block diagram illustrating a semiconductor memory according to a second embodiment of the invention.

FIG. 11 illustrates a semiconductor memory according to a second embodiment of the invention. The same components as those of the first embodiment are denoted by the same reference numerals and a detailed description thereof will thus be omitted. In the present embodiment, a command decoder 12A and a test pattern decoder 14A are provided instead of the command decoder 12 and the test pattern decoder 14 in the first embodiment. In addition, test pads (indicated by a square shape in the drawing) for receiving a test clock signal WCLK and test signals WB and TO from the burn-in test apparatus B/I are provided. Other components are the same as those of the first embodiment.

The test pads WCLK, WB, and TO are connected to the command decoder 12A through connection wires. When the FCRAM is subjected to a wafer burn-in test, the burn-in test apparatus B/I sets the test pad WB to a high logic level, and sets a serial-type command inputted from the test pad TO to a logic level indicating a test item. The test pads WCLK, WB, and TO can come in contact with a probe of the burn-in test apparatus B/I when the FCRAM is in a wafer state (or bare chip state). A packaged FCRAM does not have testing terminals connected to the test pads WCLK, WB, and TO. Although not shown, a test pad WD is connected to a ground line VSS through a high resistor.

Figure 13:
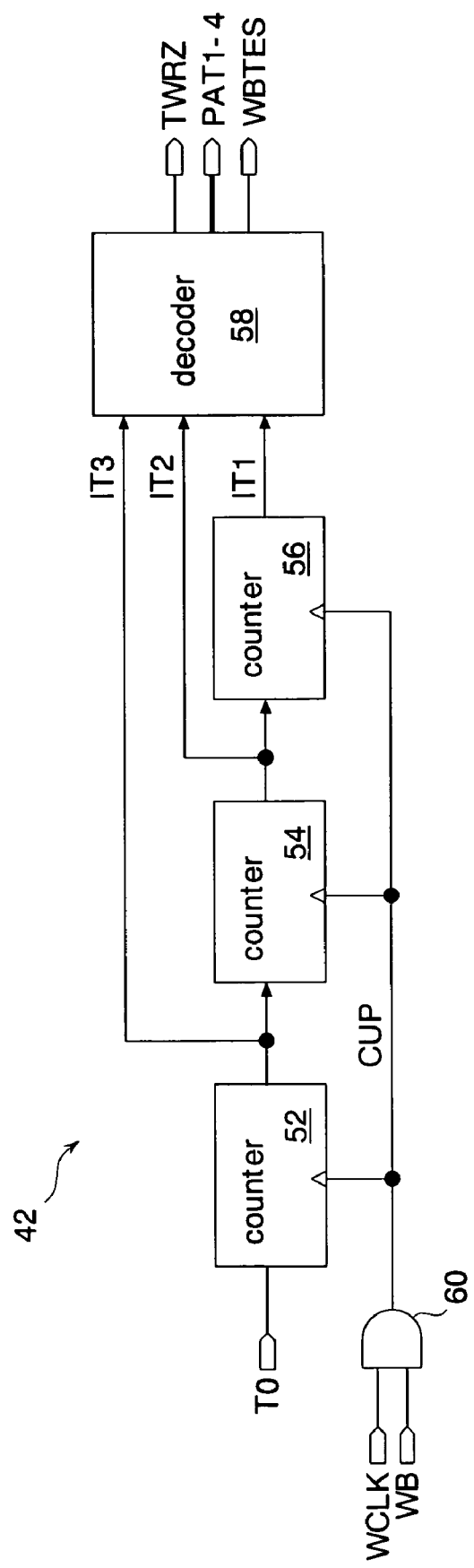
FIG. 13 is a detailed block diagram illustrating an internal decoder shown in FIG. 12.

In the present embodiment, the burn-in test of the FCRAM can be performed using a simple burn-in test apparatus B/I as well as an expensive test pattern generating apparatus TEST such as the LSI tester shown in the first embodiment. As shown in FIG. 13, the burn-in test apparatus B/I needs only to be able to generate a simple test pattern. Hereinafter, a burn-in test performed by using the test pattern generating apparatus TEST is referred to as an external burn-in test, and a burn-in test performed by using the burn-in test apparatus B/I is referred to as an internal burn-in test. In the internal burn-in test, the FCRAM can perform the burn-in test automatically without the need to receive a command signal CMD and a data signal DQ from the outside. Accordingly, the test pattern decoder 14A generates a write signal WRZ in response to a test clock signal WCLK and test signals WB and TO.

Figure 12:
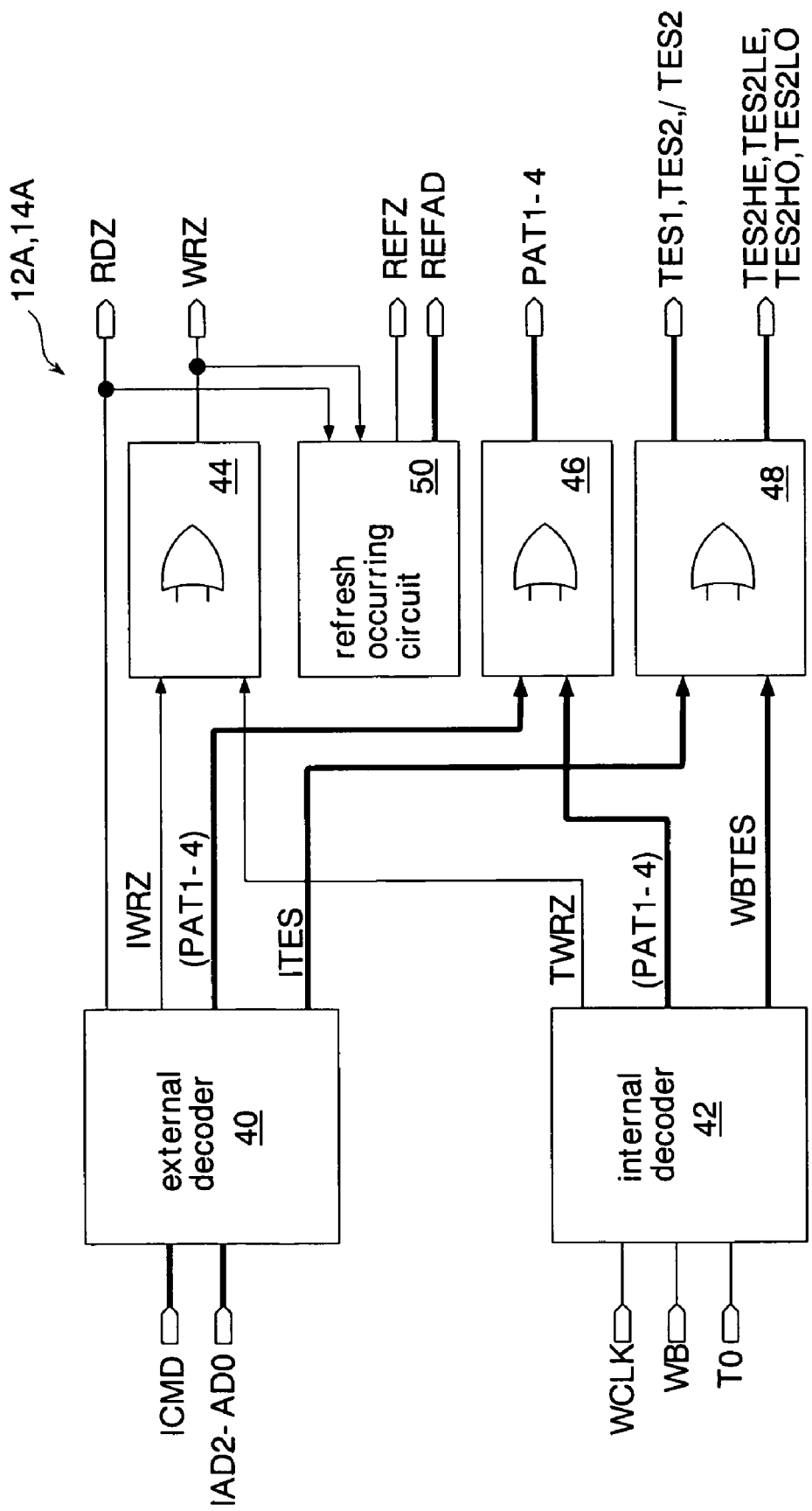
FIG. 12 is a detailed block diagram illustrating a command decoder and a test pattern decoder shown in FIG. 11.

FIG. 12 is a detailed block diagram illustrating the command decoder 12A and the test pattern decoder 14A shown in FIG. 11. The decoders 12A and 14A include an external decoder 40, an internal decoder 42, OR circuits 44, 46, and 48, and a refresh occurring circuit 50. The external decoder 40 operates during the normal operation mode NRML and the external burn-in test to output a write signal IWRZ and a test control signal ITES according to an internal command signal ICMD and an internal address signal IAD2-0. The external decoder 40 outputs the write signal IWRZ to perform the first burn-in test TEST1, and at the same time, outputs any one of the pattern selection signals PAT1-4 to select a data pattern. The pattern generator 38 shown in FIG. 11 generates pattern 1, pattern 2, pattern 3, and pattern 4 with the activation of the pattern selection signals PAT1, PAT2, PAT3, and PAT4 to apply the generated patterns to the bit lines BL and/BL.

The internal decoder 42 operates during the external burn-in test to output a write signal TWRZ, pattern selection signals PAT1-4, and a test control signal WBTES according to the test clock signal WCLK and the test signals WB and TO. The test control signals ITES and WBTES are basic signals for generating the first and second burn-in test signals TES1 and TES2, and the second burn-in test control signals TES2HE, TES2LE, TES2HO, and TES2LO.

The OR circuit 44 outputs the OR logic of the write signals IWRZ and TWRZ as a write signal WRZ. The OR circuit 48 outputs the OR logic of pattern selection signals outputted from the external decoder 40 and the internal decoder 42 as pattern selection signals PAT1-4. The OR circuit 48 outputs the OR logic of the test control signals ITES and WBTES as the first and second burn-in test signals TES1 and TES2 and the second burn-in test control signals/ TES2, TES2HE, TES2LE, TES2HO, and TES2LO.

The refresh occurring circuit 50 has an oscillator and periodically outputs a refresh signal REFZ and a refresh address signal REFAD. The refresh occurring circuit 50 has an arbiter function which determines the priority between an external access request (RDZ, WRZ) and a refresh request (REFZ). The refresh address signal REFAD is a low address signal during a refresh operation to be applied to the predecoder 20 shown in FIG. 11.

FIG. 13 is a detailed block diagram illustrating the internal decoder 42 shown in FIG. 12. The internal decoder 42 includes three 1-bit counters 52, 54, and 56 connected in series, a decoder 58 for decoding internal test signals IT3-1 outputted from the counters 52, 54, and 56, and an AND circuit 60 for generating a count-up signal CUP from a test clock signal WCLK and a test signal WD. The counters 52, 54, and 56 receive a logic value of the test signal TO in synchronization with a rising edge of the count-up signal CUP, and output the received logic value as the internal test signals IT3-1 in synchronization with a falling edge of the count-up signal CUP. The decoder 58 decodes the 3-bit internal test signals IT3-1 (serial code) maintained in the counters 52, 54, and 56, and outputs a write signal TWRZ, pattern selection signals PAT1-4, and a test control signal WBTES according to the decoded result.

Figure 14:
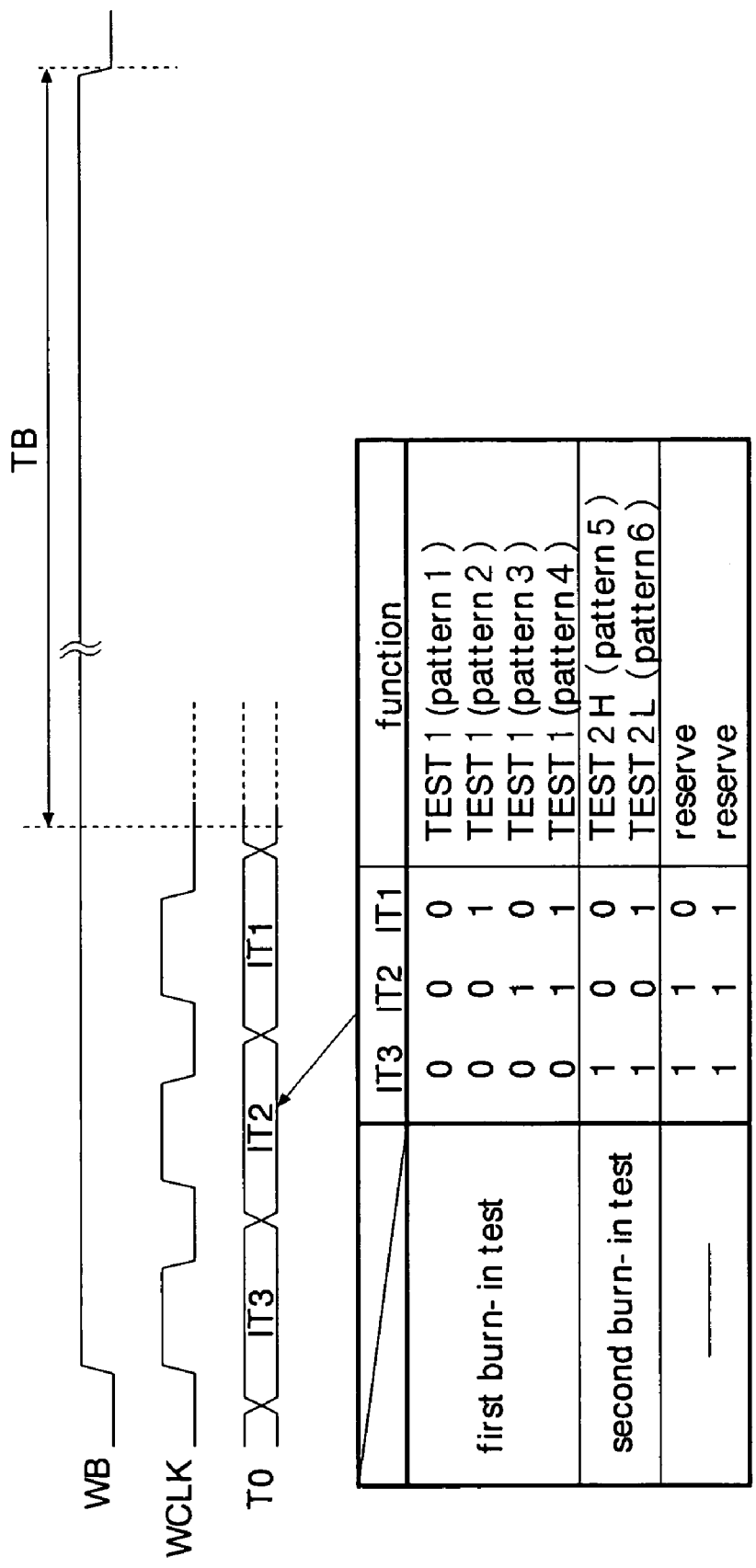
FIG. 14 is a timing diagram illustrating a test command sequence in an external burn-in test according to the second embodiment of the invention.

FIG. 14 illustrates a test command sequence in an external burn-in test according to the second embodiment of the invention. The test command sequence in the external burn-in test is the same as that of the first embodiment (FIG. 6). Meanwhile, in an internal burn-in test, during a high logic level period of a test signal WB, a serial command is sequentially input from a test pad TO in synchronization with a test clock signal WCLK. Any one of the burn-in tests indicated by the internal test signals IT1-3 that are converted from a serial command to a parallel command is performed. When it receives binary test signals TO of '000', '001', '010', and '011' as a serial command, the internal decoder 42 shown in FIG. 12 outputs a write signal TWRZ to perform the first burn-in test TEST1, and outputs pattern selection signals PAT1, PAT2, PAT3, and PAT4 indicating data patterns. With the activation of the pattern selection signals PAT1, PAT2, PAT3, and PAT4, pattern 1, pattern 2, pattern 3, and pattern 4 shown in FIG. 9 are applied to the bit lines BL and/BL.

When it receives binary test signals TO of '100' and '101' as a serial command, the internal decoder 42 outputs a test control signal WBTES to perform the second burn-in test TEST2H and TEST2L.

In the first burn-in test TEST1, a write operation is performed during the period when a test signal WB is in a high logic level (TB). In the second burn-in test TEST2H and TEST2L, when the test signal WB is in a high logic level (TB), each bit line pair BL and /BL is connected to any one of the internal supply voltage VII and the ground line VSS. By setting a length of time obtained by subtracting the serial command input period from the period TB to 25 minutes, it is possible to perform the same burn-in test as that of the first embodiment.

According to the second embodiment, the same effect as that of the first embodiment can be achieved. In addition, by using the command decoder 12A and the test pattern decoder 14A, it is possible to perform a burn-in test by means of the simple burn-in test apparatus B/I as well as an expensive test pattern generating apparatus TEST. That is, it is possible to efficiently perform a burn-in test according to a test environment.

Further, according to the above-mentioned embodiments, the invention is applied to an FCRAM with a bit line twist structure. However, the invention may be applied to a DRAM or a pseudo SRAM with a bit line twist structure. In addition, the invention may be applied not only to an FCRAM chip, a DRAM chip, and a pseudo SRAM chip, but to a system LSI equipped with memory cores of these memories.

In the above embodiments, the test code CODE is applied to the address terminals AD2-0. However, the test code CODE may be applied to other address terminals or the data terminals DQ.

The invention is not limited to the above embodiments and various modifications may be made without departing from the spirit and scope of the invention. Any improvement may be made in part or all of the components.

What is claimed is:

1. A burn-in test method of a semiconductor memory which has a plurality of bit line pairs composed of complementary bit lines respectively connected to memory cells, in which bit line pairs having a twist structure where said lines cross each other and bit line pairs having a non-twist structure where said bit lines are parallel to each other are alternately arranged, the method comprising:
    a first step of applying high and low voltage levels to said bit lines of each of said bit line pairs, respectively;
    a second step of applying same voltage levels as those in the first step to the bit line pairs having the non-twist structure, and applying voltage levels opposite to those in the first step to the bit line pairs having the twist structure;
    a third step of applying voltage levels opposite to those in the first step to said bit lines of each of said bit line pairs;
    a fourth step of applying the same voltage level as that in the third step to the bit line pairs having the non-twist structure, and applying voltage levels opposite to those in the third step to the bit line pairs having the twist structure;
    a fifth step of commonly applying high or low voltage level to each of said bit line pairs, and applying voltage levels opposite to each other to adjacent bit line pairs; and
    a sixth step of applying voltage levels opposite to those in the fifth step, wherein
    said bit line pairs are applied voltages for equal lengths of time in each of the first to sixth steps.

2. The burn-in test method of the semiconductor memory according to claim 1,
    wherein said semiconductor memory includes:
    an operation control circuit which performs a write operation to write data to said memory cells according to a command and an address applied from the outside;
    a plurality of precharge circuits which connect adjacent bit line pairs having non-twist and twist structures to first and second precharge voltage lines, respectively; and
    a precharge voltage generator which generates voltage to be supplied to said first and second precharge voltage lines, and wherein
    the first to fourth steps are performed by performing the write operation by said operation control circuit, and
    the fifth and sixth steps are performed by said precharge voltage generator having said first and second precharge voltage lines generate voltage levels opposite of each other instead of having said operation control circuit perform the write operation.

3. The burn-in test method of the semiconductor memory according to claim 1,
    wherein said semiconductor memory includes a command decoder decoding a read command and a write command applied from the outside in order to perform read and write operations with respect to said memory cells, and wherein said method further comprises the steps of:
    shifting an operation mode from a normal operation mode to a test mode when said command decoder receives an illegal command not used in normal read and write operations; and
    shifting the operation mode to one of a first burn-in test mode to perform the first to fourth steps and to a second burn-in test mode to perform the fifth and sixth steps according to a value of a test code, when the value of the test code indicated by at least one of an address and data applied together with said illegal command indicates a burn-in test.

4. The burn-in test method of the semiconductor memory according to claim 3, wherein said method further comprises the steps of:

performing the write operation by said operation control circuit in response to an entry command when said illegal command and said test code indicate the entry command to shift to said first burn-in test mode; and setting each of said first and second precharge voltage lines to one or an other of high and low voltage levels according to the value of said test code, when said illegal command and said test code indicate the entry command to shift to said second burn-in test mode.

5. The burn-in test method of the semiconductor memory according to claim 4, wherein said method further comprises the step of:

shifting the operation mode from said first and second burn-in test modes to said normal operation mode, when said illegal command and said test code received during said first and second burn-in test modes indicate an exit command.

6. A semiconductor memory comprising:

a memory cell array which includes a plurality of memory cells and a plurality of bit line pairs composed of complementary bit lines respectively connected to said memory cells, in which bit line pairs having a twist structure where said bit lines cross each other and bit line pairs having a non-twist structure where said bit lines are parallel to each other are alternately arranged;

a precharge voltage generator which generates a common precharge voltage to be supplied to first and second precharge voltage lines during a normal operation mode and a first burn-in test mode, and generates high and low voltage levels to each be supplied to one or an other of said first and second precharge voltage lines during a second burn-in test mode;

a plurality of precharge circuits which connect bit line pairs having a twist structure to said first precharge voltage line and connect bit line pairs having a non-twist structure to said second precharge voltage line while a bit line reset signal is activated;

a reset selection part which activates said bit line reset signal upon non-access of said memory cells during said normal operation mode and said first burn-in test mode, and during said second burn-in test mode, and which inactivates said bit line reset signal upon access of said memory cells during said normal operation mode and said first burn-in test mode;

a plurality of sense amplifiers which amplify a voltage difference of said bit line pairs while a sense amplifier activation signal is activated;

a sense amplifier selection part which activates said sense amplifier activation signal upon access of said memory cells during said normal operation mode and said first burn-in test mode, and which inactivates said sense amplifier activation signal upon non-access of said memory cells during said normal operation mode and said first burn-in test mode, and during said second burn-in test mode;

a plurality of column switches which connect one of said bit line pairs to data bus lines while a column selection signal is activated; and a column selection part which activates said column selection signal upon access of said memory cells during said normal operation mode and said first burn-in test mode, and which inactivates said column selection signal upon non-access of said memory cells during said normal operation mode and said first burn-in test mode, and during said second burn-in test mode.

7. The semiconductor memory according to claim 6, further comprising a command decoder which outputs read and write signals when read and write commands are received to perform read and write operations with respect to said memory cells and which shifts an operation mode from a normal operation mode to a test mode when an illegal command not used in normal read and write operations is received and, outputs a first or second burn-in test signal to set the operation mode to a first or second burn-in test mode according to the value of a test code when a value of the test code indicated by at least one of an address and data applied together with said illegal command indicates a burn-in test, wherein:

said precharge voltage generator operates according to said second burn-in test signal; and said reset selection part, said sense amplifier selection part, and said column selection part operate according to said read signal, said write signal, and said first and second burn-in test signals.

8. The semiconductor memory according to claim 7, wherein said command decoder outputs said write signal in response to an entry command when said illegal command and said test code indicate the entry command to shift to said first burn-in test mode.

9. The semiconductor memory according to claim 8, wherein said command decoder shifts the operation mode from said first and second test modes to said normal operation mode when said illegal command and said test code received during said first and second burn-in test modes indicate an exit command.

10. The semiconductor memory according to claim 6, further comprising:

a test pad which receives a test signal indicating said first and second burn-in tests;

a command decoder which outputs a first or second burn-in test signal to set an operation mode to said first or second burn-in test mode according to said test signal received by said test pad and which, outputs a write signal to perform a write operation on said memory cells in synchronization with said test signal when said test signal indicates said first burn-in test, and outputs a pattern selection signal; and a pattern generator which generates data to be written to said bit lines and said memory cells according to said pattern selection signal, wherein said precharge voltage generator operates according to said second burn-in test signal, and said reset selection part, said sense amplifier selection part, and said column selection part operate according to said write signal and said first and second burn-in test signals.

* * * * *